United States Patent [19]
Itagaki

[11] Patent Number: 5,602,863
[45] Date of Patent: Feb. 11, 1997

[54] SURFACE-EMITTING LASER DIODE ARRAY AND DRIVING METHOD THEREOF, PHOTODETECTOR, PHOTODETECTOR ARRAY, OPTICAL INTERCONNECTION SYSTEM, AND MULTIWAVELENGTH OPTICAL COMMUNICATION SYSTEM

[75] Inventor: Takushi Itagaki, Itami, Japan

[73] Assignee: Mitsubishi Denki Kabushiki Kaisha, Tokyo, Japan

[21] Appl. No.: 276,655

[22] Filed: Jul. 19, 1994

[30] Foreign Application Priority Data

Jul. 20, 1993 [JP] Japan .................................. 5-179314

[51] Int. Cl.⁶ ............................................ H01S 3/19
[52] U.S. Cl. ....................... 372/50; 372/96; 372/102; 257/82
[58] Field of Search ................... 372/50, 96, 45, 372/97, 102; 257/82, 84, 466, 440

[56] References Cited

U.S. PATENT DOCUMENTS

| | | | |
|---|---|---|---|
| 3,701,044 | 10/1972 | Paoli et al. | 331/94.5 |
| 4,163,953 | 8/1979 | Springthorpe et al. | |
| 4,360,921 | 11/1982 | Scifres et al. | 372/24 |
| 4,747,649 | 5/1988 | Heinen et al. | 350/96.12 |
| 4,751,705 | 6/1988 | Hadley et al. | 372/18 |
| 4,799,223 | 1/1989 | Streifer et al. | 372/24 |
| 4,961,198 | 10/1990 | Ishino et al. | 372/50 |
| 5,060,237 | 10/1991 | Peterson | 372/49 |
| 5,062,115 | 10/1991 | Thornton . | |
| 5,070,508 | 12/1991 | Hammer . | |
| 5,109,386 | 4/1992 | Bradley | 372/50 |
| 5,122,852 | 6/1992 | Chan et al. | 357/30 |
| 5,164,956 | 11/1992 | Lang | 372/108 |
| 5,218,584 | 6/1993 | Gfeller | 369/44.12 |
| 5,373,173 | 12/1994 | Ohata et al. | 372/50 |
| 5,408,105 | 4/1995 | Adachi et al. | 372/45 |

FOREIGN PATENT DOCUMENTS

| | | |
|---|---|---|
| 0187979 | 7/1986 | European Pat. Off. . |
| 62-44711 | 9/1987 | Japan . |
| 401257377 | 10/1989 | Japan .................................. 257/82 |
| 3257888 | 11/1991 | Japan . |
| 4-233291 | 8/1992 | Japan .................................. 372/96 |
| 2169134 | 7/1986 | United Kingdom . |

OTHER PUBLICATIONS

Kenichi Iga, "Surface Emitting Semiconductor Laser and Surface Operating Functional Devices", Journal of Electronic Information Communication Institute C–I, vol. J74–C–I, No. 5, 1992, pp. 245–256 (May).

Kojima et al, "High Efficiency Surface–Emitting Distributed Bragg Reflector Laser Array", Electronics Letters, vol. 24, No. 5, 1988.

Primary Examiner—Rodney B. Bovernick
Assistant Examiner—Yisun Song
Attorney, Agent, or Firm—Leydig, Voit & Mayer

[57] ABSTRACT

A surface-emitting LD array includes a plurality of surface-emitting LDs respectively including secondary diffraction gratings produced at the same pitch. These LDs are radially arranged on the substrate with a prescribed point on the substrate as the center of the radial arrangement so that the secondary diffraction gratings face to the center point. In this structure, the laser oscillation regions of the adjacent surface-emitting LDs are spaced apart from each other, so that the respective surface-emitting LDs are operated individually with high stability. As the result, when these surface-emitting LDs are oscillated with the same driving current, a high power laser light comprising a plurality of laser lights that are emitted from the respective LDs and have the same phase and the same wavelength is output stably in a prescribed direction. On the other hand, when these surface-emitting LDs are oscillated with different driving currents, a phase composite wave in which a plurality of laser lights having the same phase and different wavelengths are compounded is output stably in a prescribed direction.

21 Claims, 12 Drawing Sheets

Fig.17 (a) Prior Art
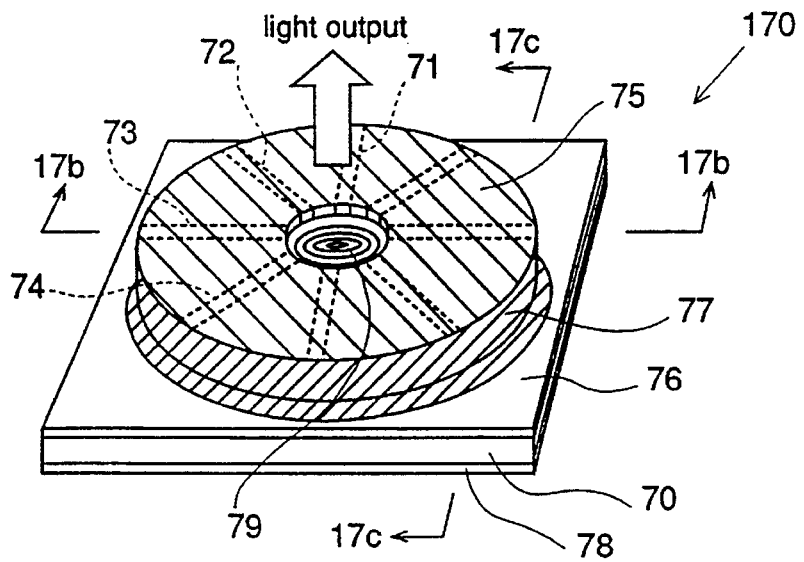
Fig.17 (b) Prior Art
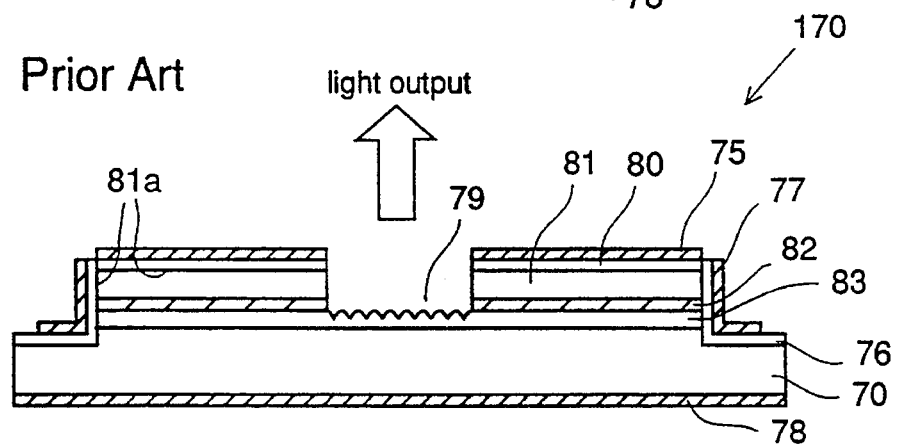
Fig.17 (c) Prior Art
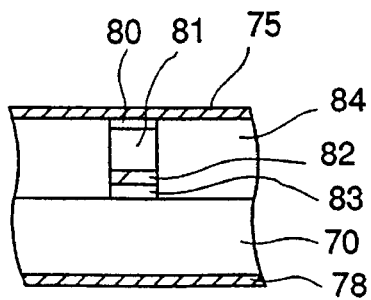

Fig.18 (a) Prior Art
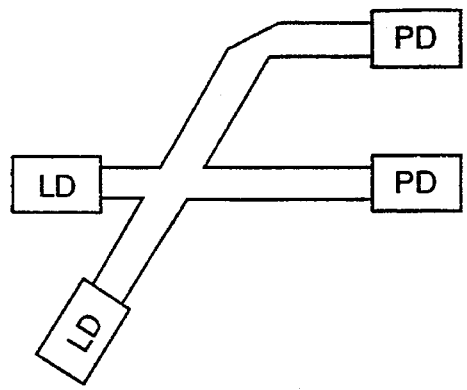
Fig.18 (b) Prior Art
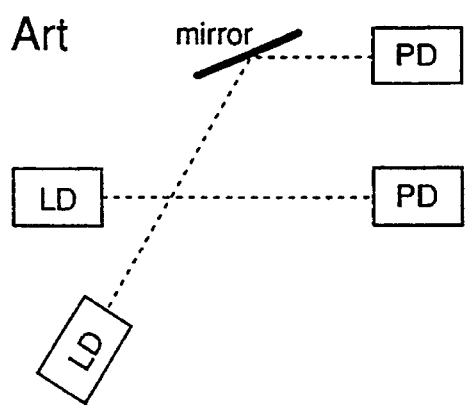
Fig.19 Prior Art
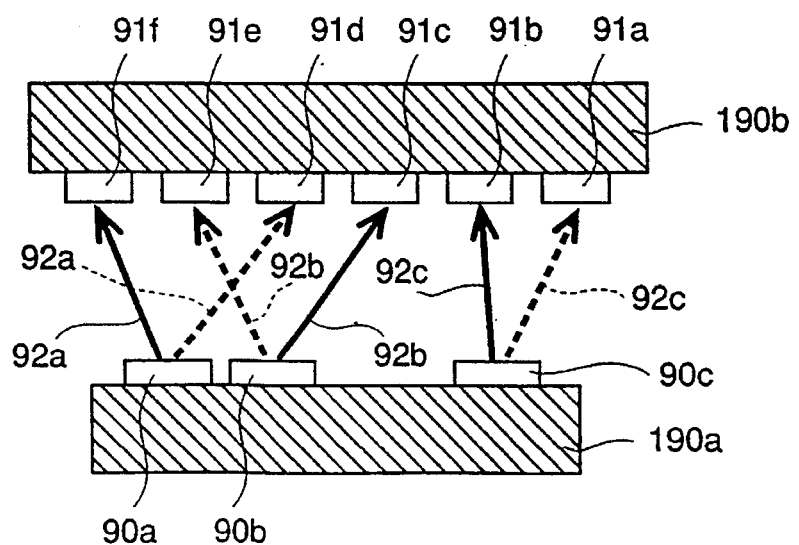

5,602,863

SURFACE-EMITTING LASER DIODE ARRAY AND DRIVING METHOD THEREOF, PHOTODETECTOR, PHOTODETECTOR ARRAY, OPTICAL INTERCONNECTION SYSTEM, AND MULTIWAVELENGTH OPTICAL COMMUNICATION SYSTEM

FIELD OF THE INVENTION

The present invention relates to a surface-emitting laser diode array and a method for driving the laser diode array. The invention also relates to a photodetector, a photodetector array, an optical interconnection system, and a multiple wave-length optical communication system.

BACKGROUND OF THE INVENTION

Surface emitting laser diodes (hereinafter referred to as surface-emitting LDs) are classified into three types by the shapes of their cavity resonators: vertical cavity surface-emitting LD, horizontal cavity surface-emitting LD, and bending cavity surface-emitting LD, as disclosed in the *Journal of Electronic Information Communication Institute*, C-I, Volume J75-C-I, Number 5, pages 245–256 (May 1992). These surface-emitting LDs emit laser light in a direction perpendicular to a main surface of the substrate whereas conventional LDs emit laser light parallel to a main surface of the substrate.

Among those three types of surface-emitting laser diodes, the horizontal cavity surface-emitting LD is produced in a relatively simple process including fabricating a diffraction grating in an optical waveguide, a technique usually employed in production of a DFB (Distributed Feedback) laser diode or a DBR (Distributed Bragg Reflector) laser diode. The horizontal cavity LD is produced so that the diffraction grating is a second order grating, i.e., having a period equal to $\lambda_0$(wavelength of laser light)/n(effective refractive index of waveguide). In the following description, this second-order diffraction grating is called a secondary diffraction grating.

FIG. 15 is a perspective view illustrating a prior art surface-emitting DBR laser disclosed in *Applied physics Letters*, 50(24), 15 Jun. 1987, pages 1705–1707. In the figure, a surface-emitting DBR laser 150 includes an n type GaAs substrate 52. There are successively disposed on the n type GaAs substrate 52 an n type GaAs buffer layer 53, an n type AlGaAs cladding layer 54, and a multiquantum well (hereinafter referred to as MQW) lightguide layer 55. The MQW lightguide layer 55 comprises alternating GaAs well layers and AlGaAs barrier layers. A p type AlGaAs cladding layer 56 having a stripe-shaped secondary diffraction grating 58 is disposed on the lightguide layer 55. A p type GaAs contact layer 59 is disposed on a part of the secondary diffraction grating 58 in a laser oscillation region 150A. Insulating films 57 are disposed on the cladding layer 56 at opposite sides of the stripe-shaped secondary diffraction grating 58, on the top surface of the diffraction grating 58, except for the laser oscillation region 150A, and on the opposite side surfaces of the diffraction grating 58 and the contact layer 59 in the-laser oscillation region 150A. A p side electrode 61 is disposed on the insulating film 57 and the contact layer 59 in the laser oscillation region 150A. A facet of the laser oscillation region 150A is coated with a high reflectivity film 60.

When current is injected into the laser oscillation region 150A through the p side electrode 61, fundamental laser oscillation occurs. When the laser light reaches the p type AlGaAs cladding layer 56 including the secondary diffraction grating 58, i.e., the optical waveguide, maximum reflectivity occurs at a wavelength determined by the period of the secondary diffraction grating 58, and a resonator is produced between the lightguide layer 55 and the high reflectivity coating film 60, whereby the laser oscillates in a single longitudinal mode. The secondary diffraction grating 58 converts laser light propagating parallel to the surface of the substrate 52 into laser light propagating perpendicular to the surface of the substrate and outputs the laser light.

When a plurality of horizontal cavity LDs, such as the above-described surface-emitting DBR LDs 150, are two-dimensionally integrated on the same substrate, a surface-emitting DBR LD array is realized.

FIG. 16 is a perspective view illustrating a prior art surface-emitting DBR LD array disclosed in *Electronics Letters*, Volume 24, Number 5, 1988, page 283. In the figure, the same reference numerals as in FIG. 15 designate the same or corresponding parts. A two-dimensional surface-emitting DBR LD array 160 includes three surface-emitting DBR LDs respectively including secondary diffracting gratings 58a, 58b, and 58c arranged parallel to each other on the same substrate 52, whereby the output power of the laser light is increased.

In this prior art surface-emitting DBR LD array 160, output laser light from the LD array 160 comprises laser light emitted from the respective laser resonators so that higher output power is obtained as compared to the DBR surface-emitting LD 150 including a single laser resonator (secondary diffraction grating) shown in FIG. 15. However, since a plurality of laser oscillating regions are disposed close to each other, when these lasers oscillate continuously, the temperature of the device significantly increases so that the refractive index in the optical waveguide, i.e., the lightguide layer and the cladding layer, unfavorably varies. This variation in the refractive index causes a difference between the Bragg wavelength of the secondary diffraction grating in the optical waveguide and the laser oscillation wavelength, resulting in an unstable beam output angle.

FIGS. 17 (a) to 17 (c) illustrate a surface-emitting DBR LD array including an annular diffraction grating disclosed in Japanese Published Patent Application Hei. 3-257888, wherein FIG. 17 (a) is a perspective view of the DBR LD array, FIG. 17(b) is a sectional view taken along line 17b–17b of FIG. 17 (a), and FIG. 17 (c) is a sectional view taken along line 17c–17c of FIG. 17 (a).

In these figures, a surface-emitting DBR LD array 170 includes an n type InP substrate 70 having opposite front and rear surfaces. An n type InGaAsP waveguide layer 83 having a band gap energy equivalent to a wavelength of about 1.3 µm, an InGaAsP active layer 82 having an energy band gap equivalent to a wavelength of about 1.55 µm, a p type InP cladding layer 81, and a p type InGaAsP cap layer 80 are successively disposed on the n type InP substrate 70. Portions of these layers 80, 81, and 82 in the center of the structure are selectively removed, and an annular secondary diffraction grating 79 is produced at the exposed surface of the n type InGaAsP waveguide layer 83. Further, these layers 80, 81, 82, and 83 are arranged in a plurality of stripe-shaped mesas across the diffraction grating 79. More specifically, as shown in FIG. 17 (a), four stripe-shaped laser resonators 71, 72, 73, and 74, each having the cross-section shown in FIG. 17 (b), are produced by selectively removing portions of the layers 80 to 83. As shown in FIG. 17 (c), a semi-insulating InP layer 84 is disposed on the substrate 70, contacting opposite sides of each laser resonator. An n side electrode 78 is disposed on the rear surface of the substrate 70. A p side electrode 75 is disposed on the stripe-shaped resonators 71 to 74 and on the semi-insulating InP layer 84. Reference numeral 81a designates facets, numeral 76 designates an insulating film, and numeral 77 designates a metal film.

In this prior art surface-emitting DBR LD array, laser light produced by laser oscillations in the respective resonators 71 to 74 is output upward from the annular diffraction grating 79 so that a high output power is obtained from the single aperture in proportion to the number of the laser resonators. In addition, the space between adjacent resonators is larger than that of the DBR LD array shown in FIG. 16. Therefore, the unwanted increase in the temperature of the device during the continuous laser oscillation is suppressed, whereby the instability of the beam output angle is reduced to some extent.

Since the prior art surface-emitting DBR-LD array outputs a high power laser light in a direction perpendicular to the main surface of the substrate, it is employed as a semiconductor light emitting element for optical interconnection of signals between a plurality of computers or for optical interconnection of signals in a computer, i.e., signals between a plurality of boards or on each board or signals between a plurality of chips. This optical interconnection system requires means for converting electrical signals into light, means for transmitting optical signals, and means for converting optical signals into electrical signals. A semiconductor light emitting element (for example, a semiconductor laser), an optical waveguide, and a semiconductor light responsive element are respectively employed for those means. FIG. 18 (a) is a schematic diagram illustrating an optical interconnection system using an optical waveguide (hereinafter referred to as optical waveguide interconnection), and FIG. 18 (b) is a schematic diagram illustrating an optical interconnection system using no waveguide (hereinafter referred to as spatial optical interconnection).

As shown in FIGS. 18 (a) and 18 (b), in the optical waveguide interconnection and the spatial optical interconnection, the direction in which laser light emitted from the semiconductor laser is guided is changed by an optical waveguide or by a mirror. Therefore, as shown in FIG. 19, if the directions of laser light beams 92a to 92c output from surface-emitting LD arrays 90a to 90c disposed on a transmitter chip 190a are controlled separately for each surface-emitting LD array, physical means for changing the optical path, such as the waveguide or the mirror, can be eliminated. In addition, information from those three surface-emitting LD arrays 90a to 90c is received by six photodiodes 91a to 91f disposed on a receiver chip 190b so that the device size is significantly reduced. In the prior art surface-emitting LD array shown in FIG. 16, however, a plurality of laser resonators are arranged parallel and close to each other, and each laser resonator is adversely affected by light leakage from the adjacent laser resonator. Therefore, even when the respective laser resonators oscillate with different driving currents and a composite wave is produced, the respective laser resonators do not operate stably so that the output direction of the obtained phase composite wave cannot be arbitrarily controlled.

On the other hand, in the prior art surface-emitting LD array 170 shown in FIG. 17 (a), since a plurality of laser light beams resulting from oscillations in the respective laser resonators 71 to 74 interfere with each other at the annular diffraction grating 79, a phase composite wave is not obtained so that the output direction of the laser light from the respective laser resonators cannot be arbitrarily controlled.

Meanwhile, multiple wavelength optical communication in which multiple wavelength light comprising laser light beams of different wavelengths is guided through an optical fiber has been recently achieved. In the surface-emitting LD array shown in FIG. 16, if the pitches of the respective secondary diffraction gratings 58a to 58c are different from each other, laser light beams with different wavelengths are output at the same time. However, in the prior art surface-emitting LD array shown in FIG. 16, the secondary diffraction gratings 58a to 58c are parallel and close to each other so that laser light beams emitted from the respective diffraction gratings interfere with each other so that multiple wavelength laser light having prescribed wavelengths cannot be stably output. In the prior art surface-emitting LD array shown in FIG. 17 (a), laser light beams with different wavelengths interfere with each other at the annular diffraction grating 79 so that multiple wavelength laser light having prescribed wavelengths cannot be stably output.

SUMMARY OF THE INVENTION

An object of the present invention is to provide a surface-emitting LD array that provides stable output angles of laser light beams from respective laser resonators (laser diodes) in continuous operation at room temperature, that permits control of the respective laser resonators separately, and that directs a composite laser light comprising laser light emitted from the respective laser resonators to an arbitrary direction with high controllability.

Another object of the present invention is to provide a method for driving the surface-emitting LD array.

A further object of the present invention is to provide a spatial optical interconnection system utilizing the surface-emitting LD array.

Another object of the present invention is to provide a surface-emitting LD array that controls a plurality of laser resonators (laser diodes) separately from each other and that outputs composite laser light comprising laser light beams of different wavelengths emitted from the respective laser resonators in a prescribed direction with high stability, without mutual interference of those laser light beams.

Still another object of the present invention is to provide a photodetector that detects only light having a prescribed wavelength from multiple wavelength laser light.

Yet another object of the present invention is to provide a multiple wavelength optical communication system including a surface-emitting LD array transmitter and a receiver that detects the multiple wavelength light transmitted from the transmitter at each wavelength.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a surface-emitting LD array includes a plurality of surface-emitting LDs respectively including secondary diffraction gratings having at the same pitch. These LDs are radially arranged on the substrate with a prescribed point on the substrate as the center of the radial arrangement so that the secondary diffraction gratings face the center point. In this structure, the laser oscillation regions of the adjacent surface-emitting LDs are spaced apart from each other so that the respective surface-emitting LDs are operated individually with high stability. As the result, when these surface-emitting LDs oscillate with the same driving current, a high power laser light comprising a plurality of laser light beams that are emitted from the respective LDs and have the same phase and the same wavelength is output stably in a prescribed direction. On the other hand, when these surface-emitting LDs oscillate with different driving currents, a phase composite wave in which a plurality of laser light beams having the same phase and different wavelengths is output stably in a prescribed direction.

According to a second aspect of the present invention, in the surface-emitting LD array, the surface-emitting LDs are arranged so that projections of the secondary diffraction gratings of the adjacent LDs are not concentric with the center point on the substrate as the center. Therefore, when these surface-emitting LDs oscillate with different driving currents to produce a phase composite wave, the mutual interference of leakage light having different phases between the adjacent surface-emitting LDs is cancelled, whereby the phase composite wave is output stably in a prescribed direction.

According to a third aspect of the present invention, in the surface-emitting LD array, a plurality of grooves for heat radiation are disposed between adjacent LDs. Therefore, thermal interference between the adjacent surface-emitting LDs is prevented, whereby the respective LDs are operated with high reliability.

According to a fourth aspect of the present invention, in a method for driving the surface-emitting LD array, the respective surface-emitting LDs are operated with different operating currents to control these LDs individually, whereby the output direction of a composite laser light of laser light beams emitted from the respective surface-emitting LDs is changed to an arbitrary direction without using a mirror or an optical waveguide.

According to a fifth aspect of the present invention, in the surface-emitting LD array, the secondary diffraction gratings of the respective LDs have different pitches. Therefore, the respective surface-emitting LDs oscillate at different oscillation wavelengths and multiwavelength laser light comprising a plurality of laser light beams having different wavelengths is obtained.

According to a sixth aspect of the present invention, a surface-emitting LD array includes a substrate having a through-hole, a plurality of surface-emitting LDs radially arranged on the substrate so that the laser emitting facets of the respective LDs face the through-hole, and means for collecting laser light beams emitted from the respective LDs and outputting the collected laser light in a direction perpendicular to the surface of the substrate. The laser light collecting means is disposed in the through-hole of the substrate. Therefore, the same operation as the surface-emitting LD array described above is achieved without using surface-emitting LDs.

According to a seventh aspect of the present invention, a photodetector comprises an optical waveguide layer, a light responsive part including a secondary diffraction grating that guides light having a prescribed wavelength to the optical waveguide layer, and a light detecting part for converting the light having a prescribed wavelength and traveling through the optical waveguide layer into a photoelectric current and outputting the photoelectric current. Therefore, light having a prescribed wavelength is detected from multiwavelength light with high precision.

According to an eighth aspect of the present invention, a photodetector array includes a plurality of the described photodetectors. These photodetectors are radially arranged on the substrate with a prescribed point on the substrate as the center of the radial arrangement so that the secondary diffraction gratings of the respective photodetectors face the center point. Therefore, when the secondary diffraction gratings of the respective photodetectors are produced at different pitches, multi-wavelength light is detected at each wavelength with high precision without using means for dividing the multiwavelength light into signal light segments having the respective wavelengths.

According to a ninth aspect of the present invention, a spatial optical interconnection system includes, as a semiconductor light emitting device for transmission, a surface-emitting LD array in which secondary diffraction gratings of the respective surface-emitting LDs are produced at the same pitch. Therefore, when driving currents applied to the respective surface-emitting LDs are controlled, a composite laser light comprising laser light beams emitted from the respective LDs is output in an arbitrary direction, whereby signal light is transmitted to a plurality of light responsive elements.

According to a tenth aspect of the present invention, a multiwavelength optical communication system comprises a surface-emitting LD array in which secondary diffraction gratings of the respective surface-emitting LDs have different pitches, a photodetector array in which secondary diffraction gratings of the respective photodetectors have different pitches, and an optical fiber connecting the LD array and the photodetector array. Therefore, multiwavelength light is transmitted to the optical fiber with high stability and a signal light having a prescribed wavelength is detected in the transmitted multiwavelength light with high precision.

BRIEF DESCRIPTION OF THE DRAWINGS

FIGS. 17 (a) to 17 (c) are a perspective view and sectional views illustrating a surface-emitting LD array according to the prior art.

FIGS. 18 (a) and 18 (b) are schematic diagrams illustrating conventional optical interconnection systems.

FIG. 19 is a schematic diagram illustrating a spatial optical interconnection system including a semiconductor light emitting element that can change the direction of output light.

DETAILED DESCRIPTION OF THE PREFERRED EMBODIMENTS

Figure 1:
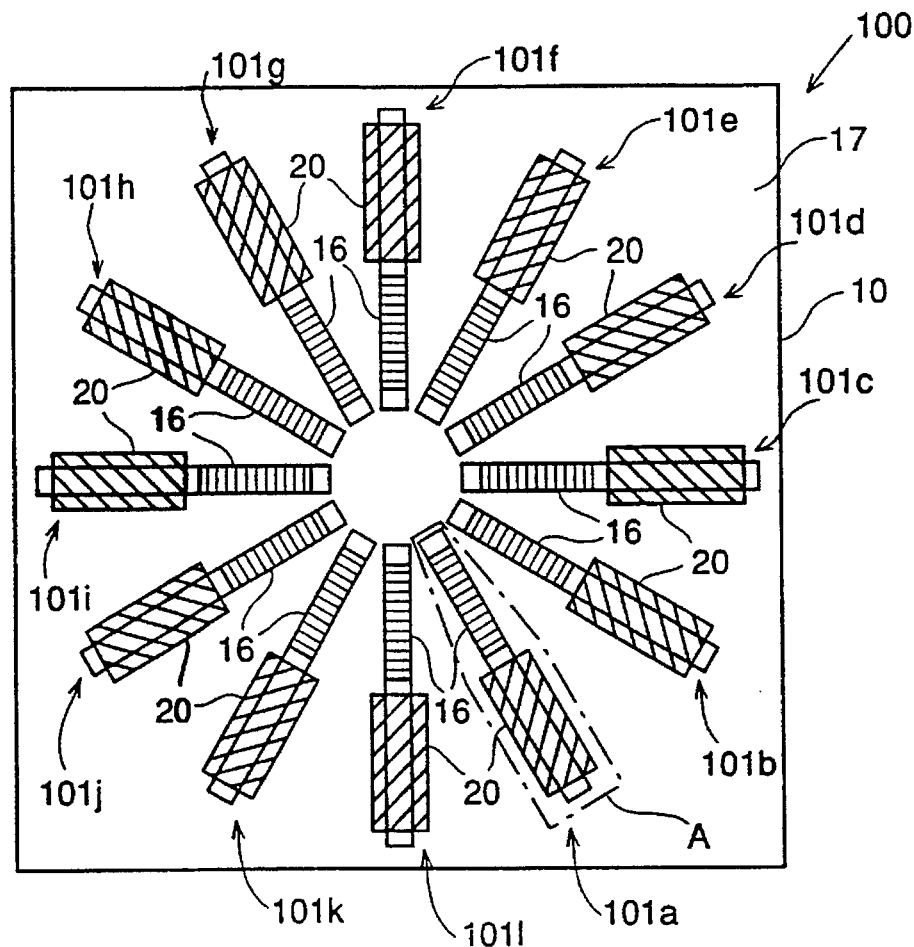
FIG. 1 (a) is a plan view illustrating a surface-emitting LD array in accordance with a first embodiment of the present invention and FIG. 1 (b) is a perspective view of an LD included in the LD array that is enclosed with alternating long and short dashed lines in FIG. 1 (a).
Figure 1:
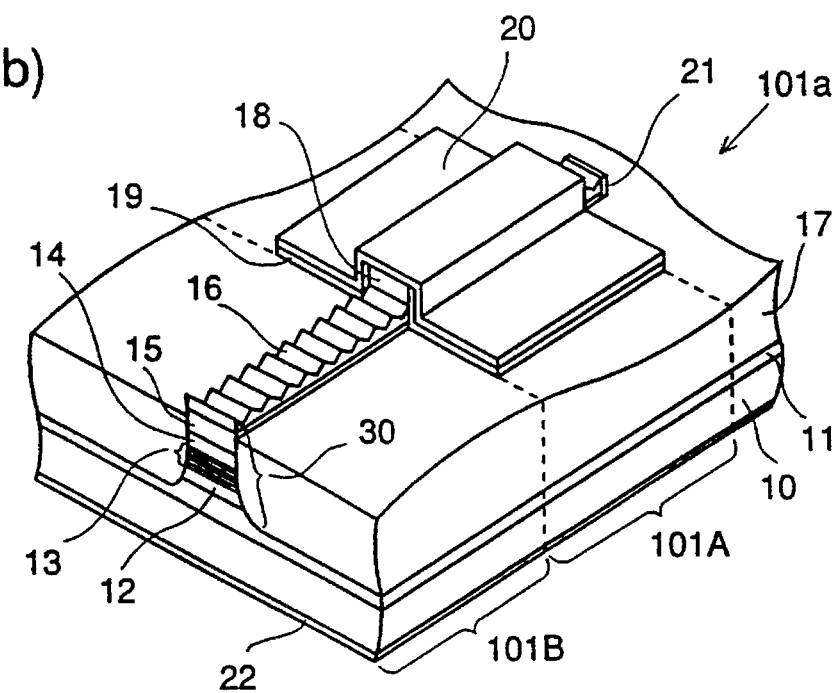

FIG. 1 (a) is a plan view illustrating a surface-emitting LD array in accordance with a first embodiment of the present invention, and FIG. 1 (b) is a perspective view of an LD included in the LD array that is enclosed with alternating long and short dash lines and designated by A in FIG. 1 (a). In these figures, a surface-emitting LD array 100 includes an n type InP substrate 10. A plurality of DBR (Distributed Bragg Reflector) surface-emitting LDs 101a to 101l, each having a secondary diffraction grating 16, are radially arranged on the n type InP substrate 10 with a prescribed point on the substrate 10 as the center of the radiation so that the secondary diffraction gratings 16 face the center point. The secondary diffraction gratings 16 of the surface-emitting LDs 101a to 101l have the same pitch. Although not shown in FIG. 1 (a), the surface-emitting LDs 101a to 101l are arranged so that the projections of the adjacent secondary diffraction gratings 16 are not concentric with the center point of the radial arrangement as the center.

The surface-emitting LDs 101a to 101l comprise the same semiconductor layers. More specifically, as shown in FIG. 1 (b), an n type InP cladding layer 11 having a thickness of 1 μm is disposed on the n type InP substrate 100. An InGaAsP lightguide layer 12 having a thickness of 300 Å is disposed on the cladding layer 11. An active layer of a multi-quantum well structure 13 (hereinafter referred to as an MQW layer) is disposed on the lightguide layer 12. The MQW layer comprises, alternatingly arranged, five to ten 100 Å thick InGaAsP barrier layers and five to ten 70 Å thick InGaAsP well layers. An InGaAsP lightguide layer 14 having a thickness of 300 Å is disposed on the MQW layer 13. A p type InP cladding layer 15 having a thickness of 0.5 μm is disposed on the lightguide layer 14. An InGaAsP secondary diffraction grating 16 is disposed on the cladding layer 15. These layers 11–16 are formed in a stripe-shaped mesa structure 30. An Fe-doped InP layer 17 is disposed on the n type InP cladding layer 11, contacting the opposite sides of the mesa structure 30 excluding the diffraction grating 16. A p type InGaAsP contact layer 18 is disposed on a part of the diffraction grating 16 in the laser oscillation region 101A. An insulating film 19 is disposed on opposite sides of the diffraction grating 16 and the contact layer 18 in the laser oscillation region 101A and on part of the Fe-doped InP layer 17 in the vicinity of the diffraction grating 16. A p side electrode 20 comprising Cr/Au is disposed on the insulating film 19 and the top surface of the contact layer 18. Laser light is emitted from the secondary diffraction grating 16 in the laser light emitting region 101B in a direction perpendicular to the surface of the substrate 10. An n side electrode 22 comprising AuGe/Ni/Au is disposed on the rear surface of the substrate 10. A high reflectivity film 21 is disposed at an end of the secondary diffraction grating 16 and on a portion of the p type InP cladding layer 15 protruding from the p side electrode 20. The high reflectivity film 21 may be disposed on the Fe-doped InP layer 17.

The process of fabricating the LDs 101a to 101l of the surface-emitting LD array 190 is basically identical to the fabrication process of the prior art surface-emitting LD. However, in the fabrication process of the secondary diffraction grating including depositing and prebaking a photoresist film, patterning the photoresist film as a diffraction grating with a prescribed pitch using the two-beam interference exposure method with a laser light source, and forming the secondary diffraction grating in a semiconductor layer using the photoresist pattern as a mask, one exposure process produces a diffraction grating photoresist pattern only in one direction. Therefore, in the present invention, utilizing the fact that the surface-emitting LD array 100 has a rotationally symmetric structure with the center point of the device as the center of symmetry, the substrate 10 is partially masked so that surface-emitting LDs on which secondary diffraction gratings extending in the same direction are to be formed are exposed, and the substrate is subjected to multiple beam interference exposure. The substrate 10 or the optical source for the interference exposure (not shown) is turned about the center of the device, and secondary diffraction gratings extending in the same direction are successively produced by multiple beam interference exposure. Alternatively, the photoresist film may be patterned in a radial diffraction grating using EB (Electron Beam) exposure, or the diffraction grating pattern may be formed directly on the semiconductor layer by FIBE (Focused Ion Beam Etching) without using a photoresist film.

In the surface-emitting LD array 100 according to the first embodiment of the invention, the respective LDs 101a to 101l are separated from each other by mesa etching. In the mesa etching process for conventional InGaAsP-InP LDs, wet etching using a Br base solution is employed. However, this wet etching varies significantly depending on the surface orientation of the substrate, so that different planes and shapes are produced according to the directions in which the patterns are produced. Therefore, favorable separation of the LDs is not achieved by wet etching. In this embodiment of the invention, dry etching, such as RIE (Reactive Ion Etching) or FIBE (Focused Ion Beam Etching), is employed to achieve element separation with no dependency on surface orientation.

Figure 2:
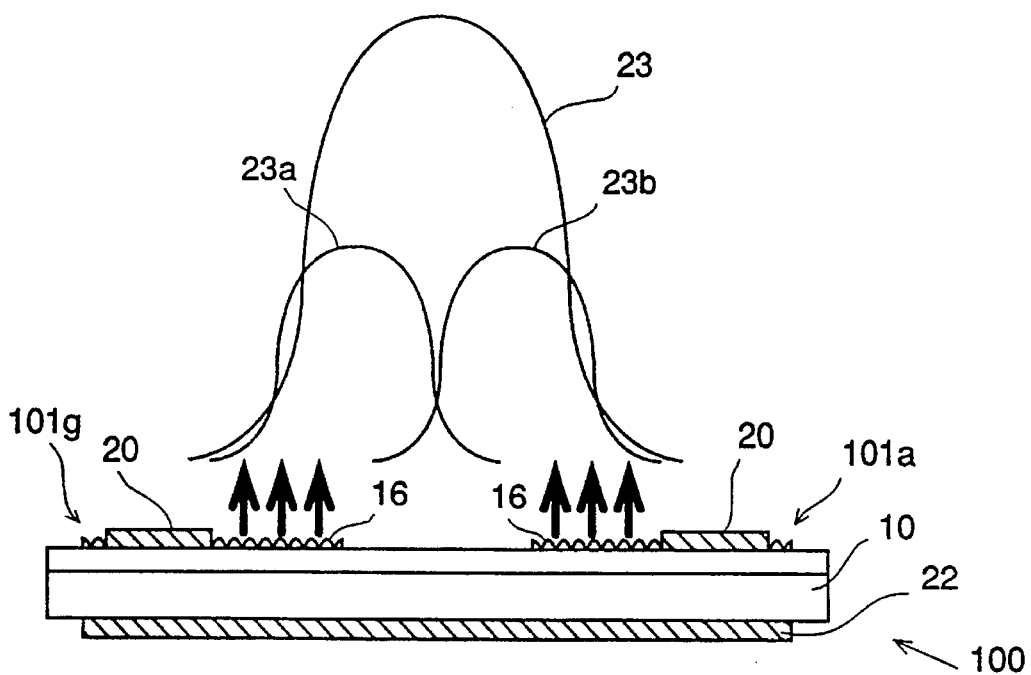
FIGS. 2 and 3 are sectional views for explaining the operation of the surface-emitting LD array shown in FIG. 1.

When the respective LDs 101a to 101l included in the surface-emitting LD array 100 oscillate upon the injection of currents of the same magnitude, as shown in FIG. 2, laser light beams 23a and 23b emitted from the secondary diffraction gratings 16 of the surface-emitting LDs 101a to 101l have the same wavelength and the same phase. These laser light beams interfere with each other at the center of the device, resulting in a high power laser light 23. FIG. 2 is a sectional view taken along the opposite LDs 101a and 101g, and only two laser light beams 23a and 23b are shown in the figure. However, laser light beams of the same wavelength and the same phase are emitted from all of the LDs 101a to 101l.

Figure 3:
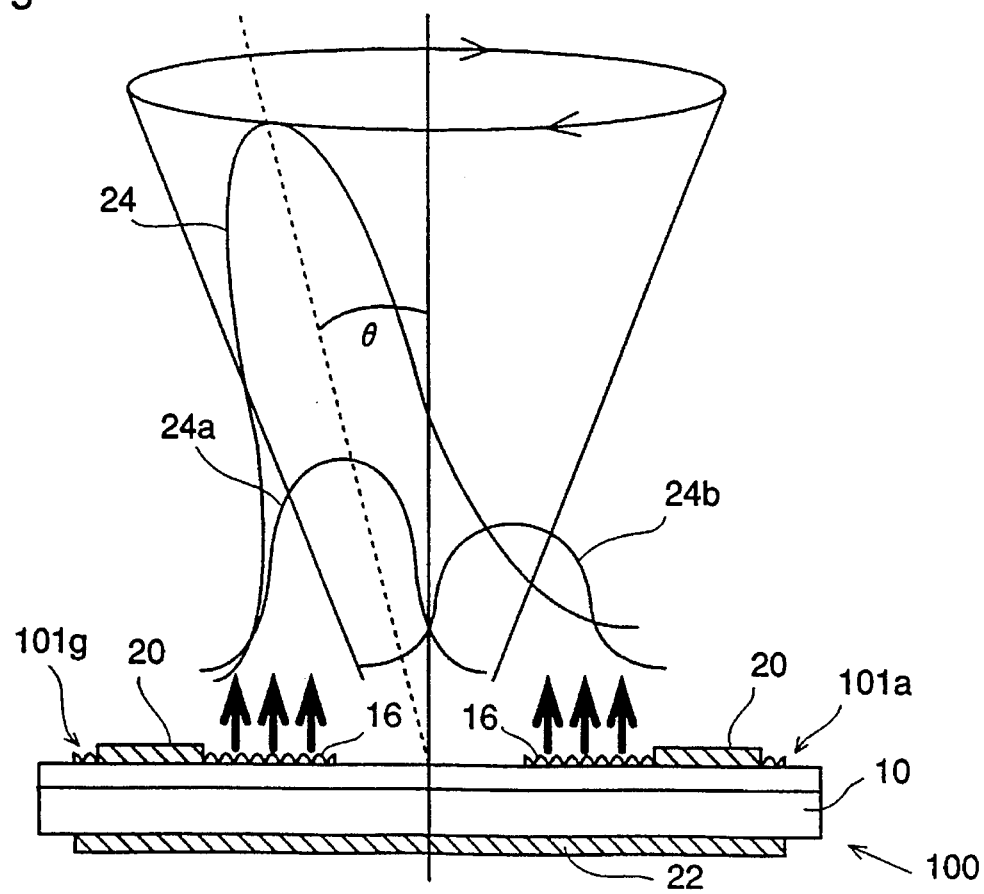

On the other hand, when the respective LDs 101a to 101l included in the surface-emitting LD array 100 oscillate upon the injection of currents of different magnitudes, since laser light beams 24a and 24b emitted from the secondary diffraction gratings 16 of the respective surface-emitting LDs 101a to 101l have the same wavelength and different phases, as shown in FIG. 3, a far-field laser light 24 that is output from the center of the LD array is a phase composite wave. Therefore, it is possible to vary the peak intensity angle θ that is determined by the difference in phases between the respective light beams of the LDs 101a to 101l by controlling the driving current applied to each of the surface-emitting LDs 101a to 101l to change the phase of the laser light emitted by each LD. The peak angle θ variable direction is set with respect to the light emitting direction, i.e., a direction perpendicular to the substrate, since the surface-emitting LDs 101a to 101l are radially arranged with respect to a prescribed point on the substrate as the center. FIG. 3 is a sectional view taken along the opposite LDs 101a and 101g, and only two laser light beams 24a and 24b are shown in the figure. However, laser light beams are emitted from all of the LDs 101a to 101l.

Figure 4:
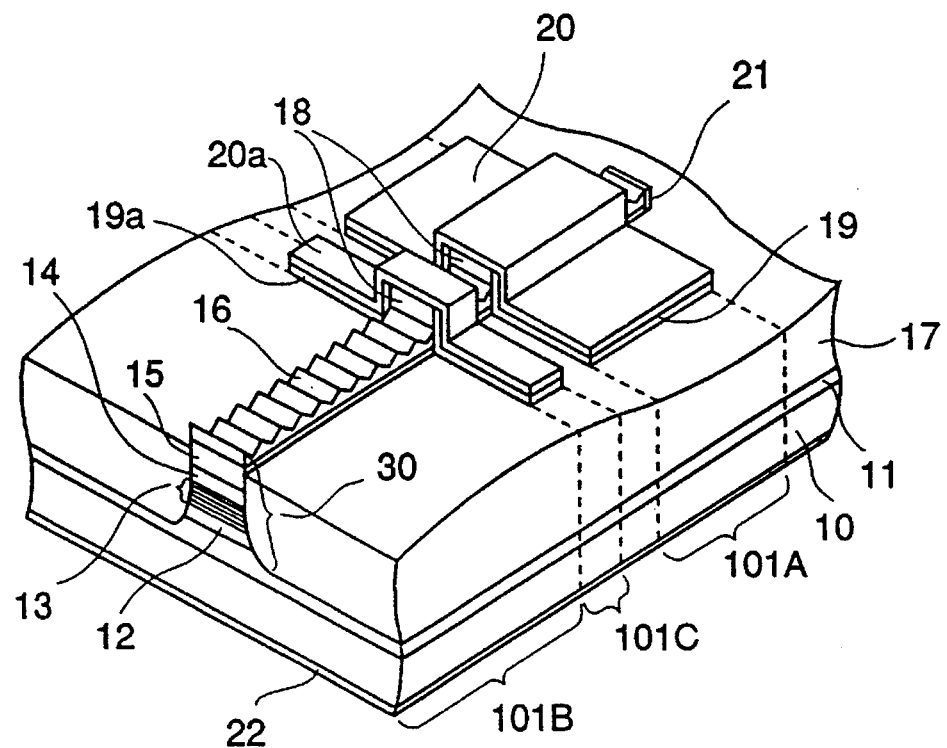
FIG. 4 is a perspective view illustrating a surface-emitting LD as shown in FIG. 1 (b) and having a phase control function.

In the described operation, as a method for controlling the oscillation phase of each LD, a phase control means included in a variable wavelength three-electrode DBR laser disclosed in *Electronics Letters*, Volume 23, page 404, 1987 may be employed. More specifically, a phase control region is formed in a prescribed portion of an optical waveguide, and current is injected into the phase control region to change the carrier concentration in that region. The change in the carrier concentration causes the refractive index in that region to change. The variation in phase caused by variation in the laser oscillation wavelength is compensated and controlled by the change in the refractive index. FIG. 4 is a perspective view illustrating a part of a surface-emitting LD including such phase control means. In FIG. 4, the same reference numerals as in FIG. 1 (b) designate the same or corresponding parts. The structure of FIG. 4 is identical to the structure of FIG. 1 (b) except that a phase control region 101c comprising an additional insulating film 19a and an additional p side electrode 20a is disposed between the laser oscillation region 101A and the laser light emitting region 101B. The insulating film 19a and the p side electrode 20a are produced simultaneously with the insulating film 19 and the p side electrode 20 in the laser oscillation region 101A.

In the surface-emitting LD array 100 according to the first embodiment of the invention, a plurality of separated surface-emitting LDs 101a to 101l, each including a secondary diffraction grating 16 having the same pitch, are radially disposed on the semiconductor substrate 10 so that a prescribed point on the substrate 10 is the center of the radial arrangement and the secondary diffraction gratings 16 of the respective LDs face the center point. Since the surface-emitting LDs 101a to 101l are separated from each other and the adjacent laser oscillation regions are adequately spaced from each other, when the respective surface-emitting LDs 101a to 101l are continuously operated at room temperature with injection currents of the same magnitude, the respective LDs stably oscillate without being adversely affected by light leakage from the adjacent LD. As the result, high power laser light is stably output at a prescribed output angle.

When the respective surface-emitting LDs 101a to 101l are operated with currents of different magnitudes, since the respective LDs are separated from each other and the adjacent laser oscillation regions and the adjacent secondary diffraction gratings are adequately spaced from each other, thermal interference and mutual interference of light leaking between adjacent LDs are prevented. As a result, the respective LDs 101a to 101l stably emit laser light beams of prescribed phases, and a phase composite wave having a prescribed phase is output in a prescribed direction with high reliability. Further, the intensity peak angle θ of the phase composite wave can be changed by controlling the current applied to each of the surface-emitting LDs 101a to 101l to change the oscillation phase of the LD. For example, when the surface-emitting LD array 100 is mounted on a transmitter chip, it is possible to transmit information from the LD array 100 on the transmitter chip to any photodiode among a plurality of photodiodes arranged in a matrix on a receiver chip without using any physical optical path changing means, such as the optical waveguide or the mirror shown in FIG. 19.

Furthermore, the surface-emitting LDs 101a to 101l are radially arranged so that the projections of the secondary diffraction gratings 16 of the adjacent LDs are not concentric with the prescribed center point on the n type InP substrate 10, so that mutual interference of phases of light leaking from adjacent LDs cancel. As the result, the respective surface-emitting LDs 101a to 101l are operated at desired oscillation wavelengths and phases with high reliability.

Figure 5:
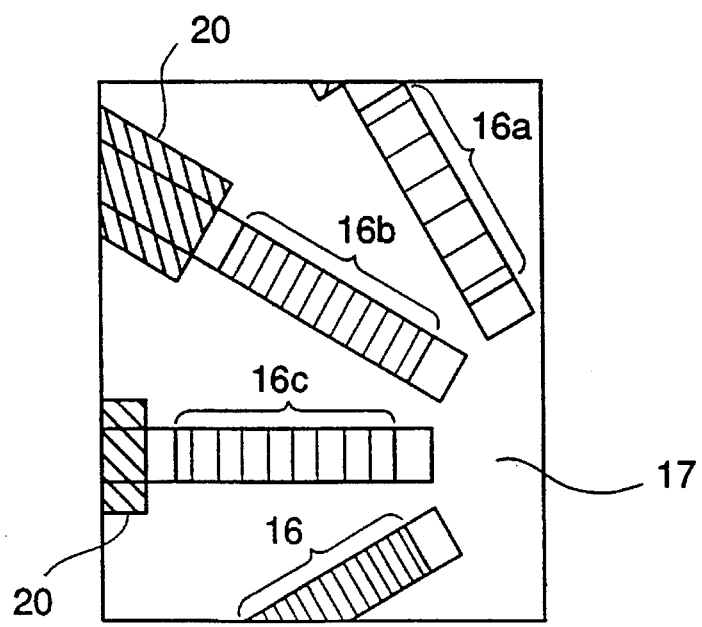
FIG. 5 is a plan view illustrating parts of secondary diffraction gratings included in a surface-emitting LD array in accordance with a second embodiment of the present invention.

FIG. 5 is a schematic diagram illustrating a part of a surface-emitting LD array in the vicinity of the secondary diffraction gratings, in accordance with a second embodiment of the present invention. In FIG. 5, the same reference numerals as in FIG. 1 (a) designate the same or corresponding parts. Reference numerals 16a to 16c designate secondary diffraction gratings having different pitches. The surface-emitting LD array according to this second embodiment is basically identical to the surface-emitting LD array shown in FIGS. 1 (a) and 1 (b) except that the respective surface-emitting LDs include secondary diffraction gratings having different pitches.

In the DBR surface-emitting LD, output laser light has a single wavelength determined by the pitch of the secondary diffraction grating. Therefore, laser light output from the surface-emitting LD array of this second embodiment is multiple wavelength light comprising a plurality of laser light beams having different wavelengths. The maximum number of different wavelengths is equal to the number of the surface-emitting LDs disposed on the substrate.

According to the second embodiment of the invention, since the secondary diffraction gratings of the respective surface-emitting LDs have different pitches, multiple wavelength output light comprising laser light beams having different wavelengths is attained, whereby several information streams are transmitted at the same time.

Figure 6:
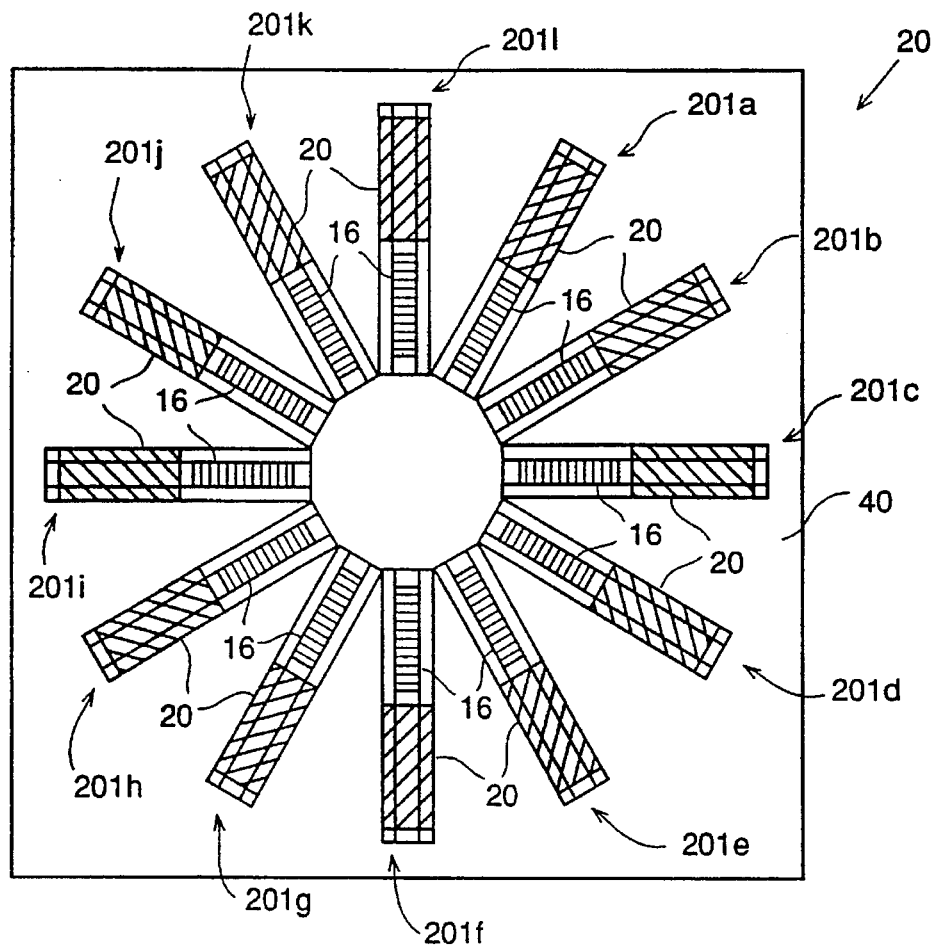
FIG. 6 is a plan view illustrating a surface-emitting LD array in accordance with a third embodiment of the present invention.
Figure 7:
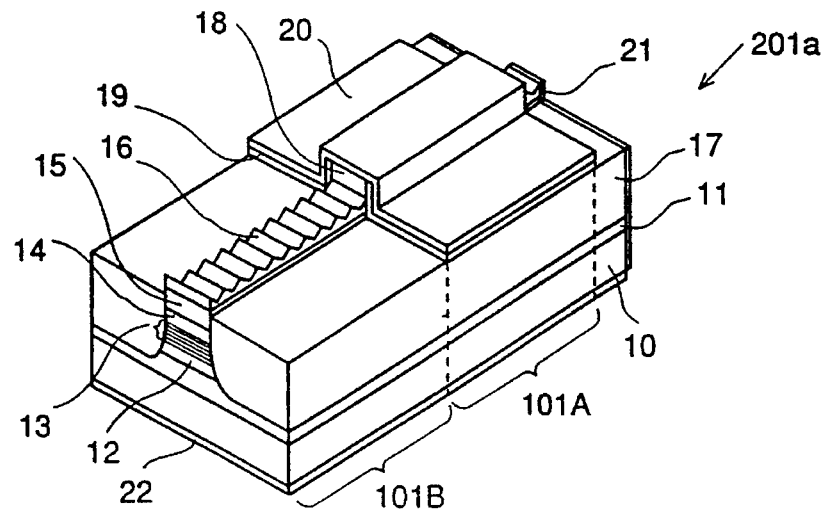
FIG. 7 is a perspective view illustrating a surface-emitting LD included in the surface-emitting LD array shown in FIG. 6.

FIG. 6 is a plan view illustrating a surface-emitting LD array in accordance with a third embodiment of the present invention, and FIG. 7 is a perspective view illustrating each surface-emitting LD included in the array of FIG. 7. In these figures, the same reference numerals as in FIGS. 1 (a) and 1 (b) designate the same or corresponding parts. A surface-emitting LD array 200 comprises a plurality of surface-emitting LD chips 201a to 201l radially arranged on an insulating substrate 40 with a prescribed point on the substrate 40 as the center of the radial arrangement so that the secondary diffraction gratings 16 of the respective LDs face the center point. Although only the surface-emitting LD 201a is shown in FIG. 7, other LDs 201b to 201l have the same structure as shown in FIG. 7. The secondary diffraction gratings 16 have the same pitch.

In the surface-emitting LD array 200 according to this third embodiment of the invention, the surface-emitting LD chips 201a to 201l are fabricated individually and mounted on the insulating substrate 40. Each of those LD chips 201a to 201l or the insulating substrate 40 has an electrode pad connected to the n side electrode. In this surface-emitting LD array 200, the same effects as described for the first embodiment are achieved. Further, since the respective LDs 201a to 201l are spaced from each other, optical and thermal interference between adjacent LDs is prevented, whereby the respective LDs are operated stably with desired oscillation wavelengths and phases.

Figure 8:
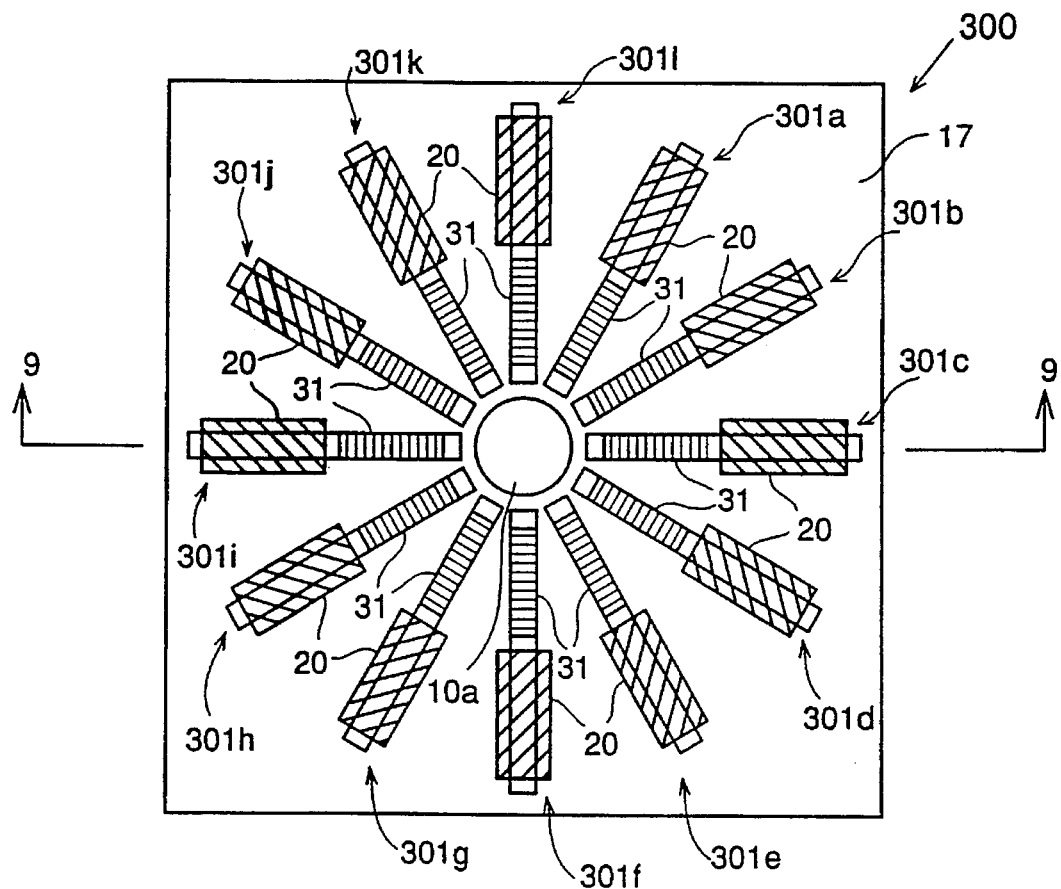
FIG. 8 is a plan view illustrating a surface-emitting LD array in accordance with a fourth embodiment of the present invention.
Figure 9:
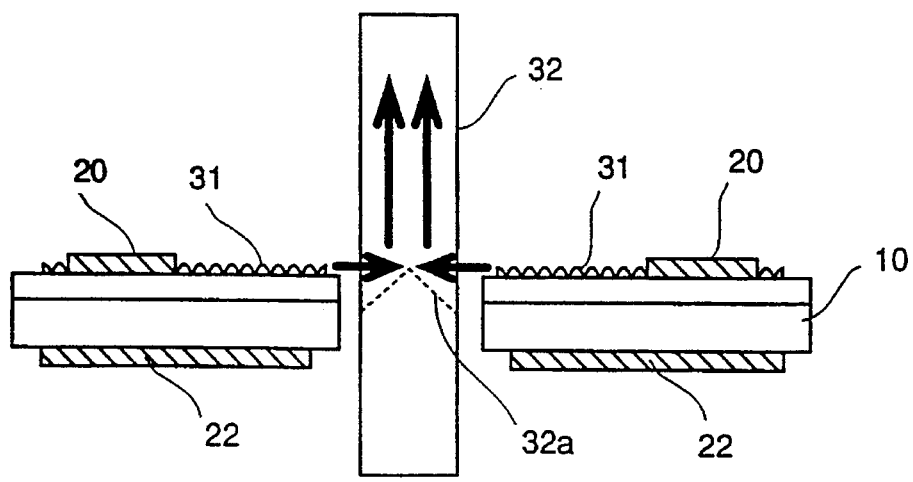
FIGS. 9 and 10 are sectional views of the surface-emitting LD array shown in FIG. 8.

FIG. 8 is a plan view illustrating a surface-emitting LD array in accordance with a fourth embodiment of the present invention, and FIG. 9 is a sectional view taken along a line 9—9 of FIG. 8. In these figures, the same reference numerals as in FIG. 1 (a) designate the same or corresponding parts. A surface-emitting LD array 300 includes an n type InP substrate 10 having a through-hole 10a. A plurality of DBR-LDs 301a to 301l, each including a primary diffraction grating 31, are radially arranged on the n type InP substrate 10 with the primary diffraction gratings 31 of the respective LDs facing the through-hole 10a in the substrate 10. As shown in FIG. 9, an optical fiber 32 including a conical mirror 32a with a 45° apex angle is inserted in the through-hole 10a of the substrate 10 so that laser light emitted from the respective LDs 301a to 301l strikes the mirror 32a. The mirror 32a is produced by mechanical processing. In this structure, a composite of the laser light beams emitted from the respective LDs 301a to 301l is output upward in a direction perpendicular to the surface of the substrate.

Figure 10:
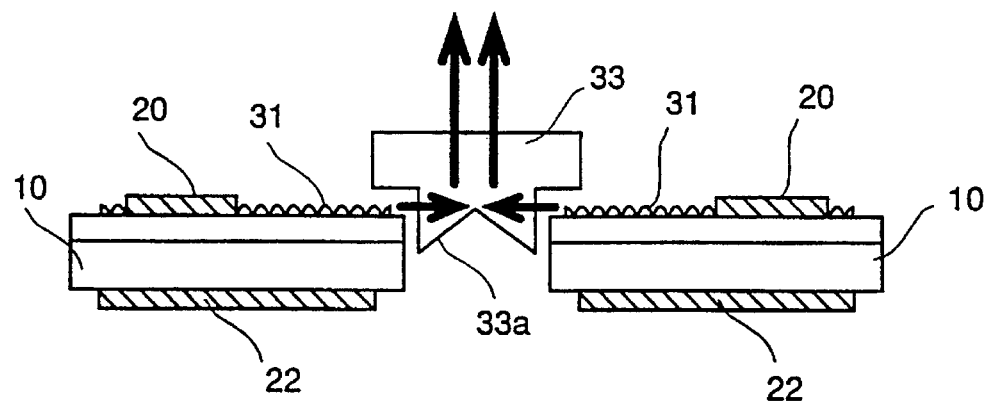

In this fourth embodiment of the invention, since the optical fiber 32 for collecting the laser light emitted from the respective primary diffraction grating DBR-LDs is disposed in the through-hole 10a of the substrate 10, an LD array having the same function as the surface-emitting LD array 100 according to the first embodiment is obtained. In place of the optical fiber 32, an optical coupling element comprising quartz and having a conical recess 33a with an apex angle of 45° as shown in FIG. 10 may be employed. The conical recess 33a is produced by mechanical processing.

In place of the conical recess 33a, the optical coupling element 33 may include a region where the refractive index is conically varied. If an Er-doped optical fiber or optical coupling element is used, the surface-emitting LD array of this embodiment can pump a fiber amplifier.

Also in this surface-emitting LD array, when the LDs 301a to 301l are arranged so that the projections of the primary diffraction gratings of the adjacent LDs are not concentric with the central through-hole 10a of the substrate 10, the respective LDs 301a to 301l are operated stably with prescribed oscillation wavelengths and phases.

Figure 11:
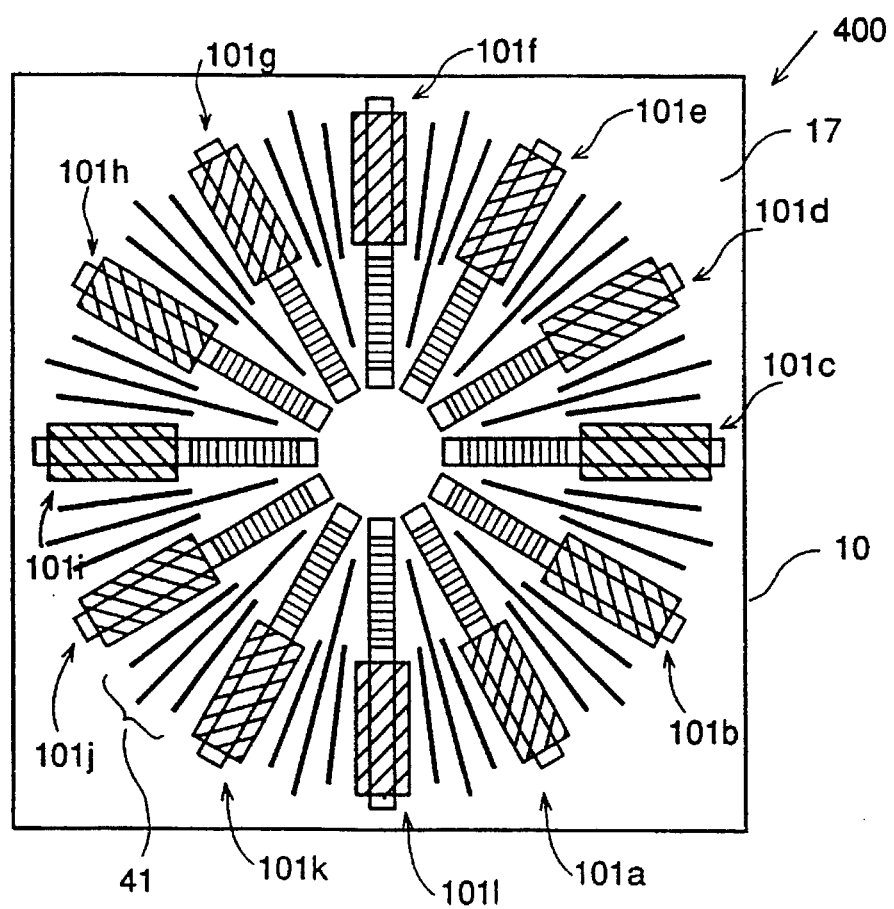
FIG. 11 is a plan view illustrating a surface-emitting LD array in accordance with a fifth embodiment of the present invention.

FIG. 11 is a plan view illustrating a surface-emitting LD array in accordance with a fifth embodiment of the present invention. In the figure, the same reference numerals as in FIG. 1 (a) designate the same or corresponding parts. A surface-emitting LD array 400 of this fifth embodiment is fundamentally identical to the surface-emitting LD array 100 of the first embodiment except that a plurality of separation grooves 41 for heat radiation are formed in the Fe-doped InP layer 17 between adjacent LDs. More specifically, three grooves, i.e., a center groove as long as the total length of the LD and two grooves as long as the laser oscillation region of the LD and sandwiching the center groove, are located between two adjacent LDs. The grooves 41 reach the n type InP substrate 10 or the vicinity of the substrate 10.

In the surface-emitting LD array 400 of this fifth embodiment, since the separation grooves 41 for heat radiation are located in the Fe-doped InP layer 17 between adjacent LDs, the surface area between the adjacent LDs is increased. Therefore, radiation of heat into space above the device is improved, so that the respective LDs are operated with no thermal interference between adjacent LDs. As the result, laser light having prescribed wavelength and phase is output with high reliability.

Figure 12:
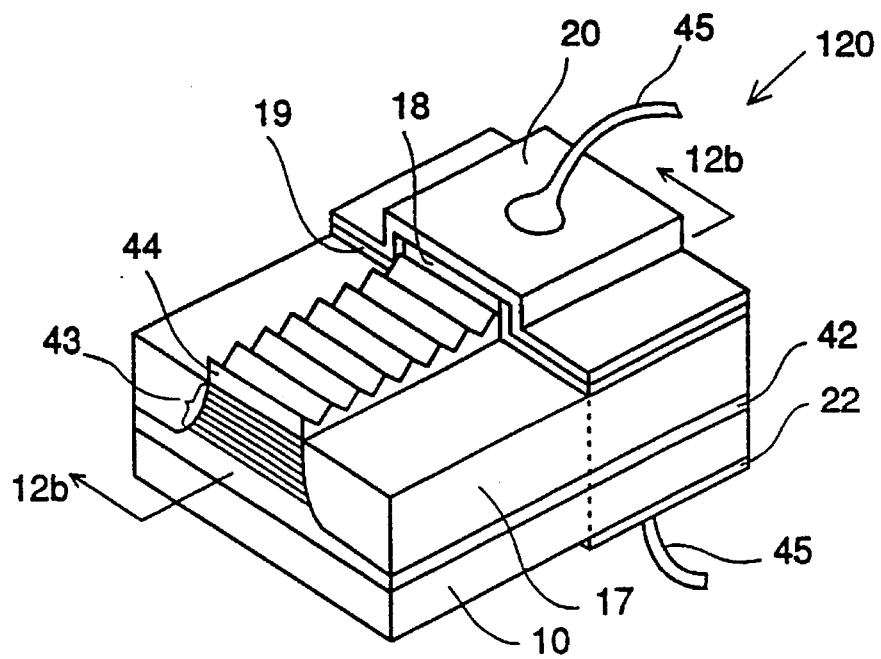
FIGS. 12 (a) and 12 (b) are a perspective view and a sectional view illustrating a photodetector in accordance with a sixth embodiment of the present invention.
Figure 12:
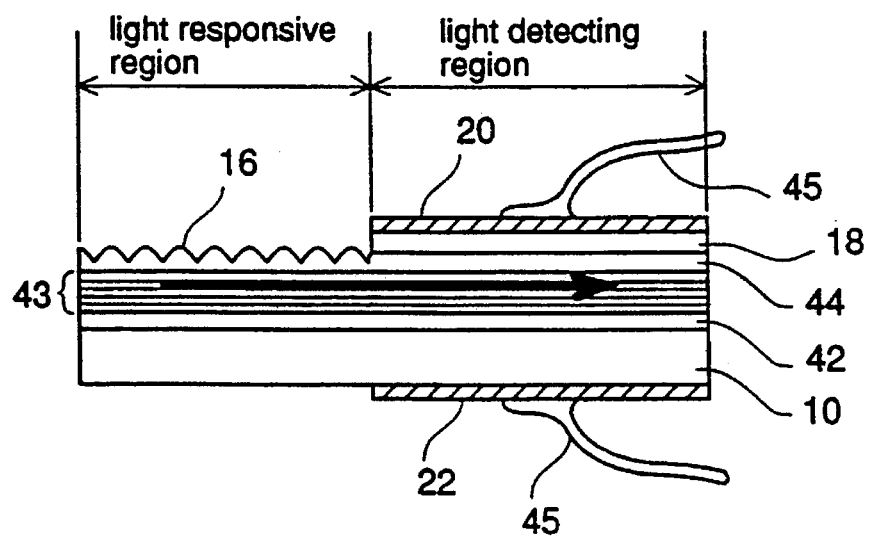

FIG. 12 (a) is a perspective view illustrating a photodetector in accordance with a sixth embodiment of the present invention, and FIG. 12 (b) is a sectional view taken along line 12b–12b of FIG. 12 (a). In these figures, the same reference numerals as in FIG. 1 (b) designate the same or corresponding parts. A photodetector 120 includes an n type InP substrate 10. An n type InP buffer layer 42 having a thickness of 1000 Å is disposed on the substrate 10. An optical waveguide layer 43 is disposed on the buffer layer 42. The optical waveguide layer 43 has a multiquantum well structure (herein-after referred to as an MQW) comprising, alternatingly arranged, five to ten 100 Å thick InGaAsP barrier layers and five to ten 70 Å thick InGaAsP well layers. A p type InP buffer layer 44 having a thickness of 1000 Å is disposed on the optical waveguide layer 43. These layers 42, 43, and 44 grown on the substrate 10 are formed in a stripe-shaped mesa. A part of the p type InP buffer layer 44 in the light responsive region of the photodetector is patterned in a secondary diffraction grating 16. An Fe-doped InP layer 17 is disposed on the n type InP buffer layer 42, contacting the opposite sides of the mesa structure excluding the p type InP buffer layer 44. A p type InGaAsP contact layer 18 is disposed on a part of the p type InP buffer layer 44 in the light detecting region of the photodetector. An insulating film 19 is disposed on the opposite side surfaces of the p type InGaAsP contact layer 18 and on the upper surface of the Fe-doped InP layer 17 in the light detecting region. A p side electrode 20 comprising Cr/Au is disposed on the upper surface of the p type InGaAsP contact layer 18 and on the insulating film 19. The band gap energy of the MQW optical waveguide layer 43 in the light responsive region beneath the secondary diffraction grating 16 is wider than the equivalent wavelength of light to be detected in the light detecting region, and the band gap energy of the MQW optical waveguide layer 43 beneath the electrode 20 is narrower than the equivalent wavelength of light to be detected in the light detecting region.

In production of the MQW optical waveguide layer 43, a region of the buffer layer 42 that is to become the light detecting region, i.e., under the p side electrode 20, is sandwiched with $SiO_2$ or SiN films, and the MQW layer 43 is epitaxially grown on the buffer layer 42, whereby the thickness of the well layers of the MQW structure is increased in the light detecting region. The described difference in the energy band gaps is produced in this way.

For example, when 1.55 μm band multiple wavelength communication laser light comprising a plurality of signal light beams having different wavelengths (the interval between the wavelengths is several angstroms to several tenths of an angstrom) is input to the light responsive region of the photodetector 120 in the direction perpendicular to the surface of the substrate 10, only a single wavelength of light that is selected by the secondary diffraction grating 16 having a pitch of about 4400 Å is turned to the longitudinal direction of the diffraction grating, i.e., parallel to the surface of the substrate 10, and the light is transmitted through the optical waveguide layer 43 to the light detecting region. The optical waveguide layer 43 in the light detecting region has a band gap energy narrower than the equivalent wavelength of the light to be detected, so that the light is absorbed by the optical waveguide layer 43 and converted into photoelectric current. On the other hand, light other than the selected single wavelength light is reflected by or transmitted through the secondary diffraction grating 16, or turned to a direction other than the described direction and is not transmitted to the light detecting region.

In the photodetector 120 according to the sixth embodiment of the invention, light of a prescribed wavelength can be detected from multiple wavelength signal light without being adversely affected by light of other wavelengths, whereby signal detection with a high S/N ratio is achieved.

In the structure shown in FIGS. 12 (a) and 12 (b), an anti-reflection film that makes the reflectivity at the detected wavelength zero may be disposed on the surface of the secondary diffraction grating 16. In this case, the detected photoelectric current is increased, whereby the S/N ratio is further improved.

The single wavelength light turned to the direction parallel to the substrate by the secondary diffraction grating 16 and traveling through the optical waveguide 43 is guided in both directions toward the light detecting region and toward the end facet of the device. Therefore, when the end facet of the device is perpendicular to the substrate and an anti-reflection film that makes the reflectivity at the detected wavelength 100% is disposed on the end facet, the single wavelength light guided to the light detecting region is further increased, whereby the S/N ratio is further improved.

Figure 13:
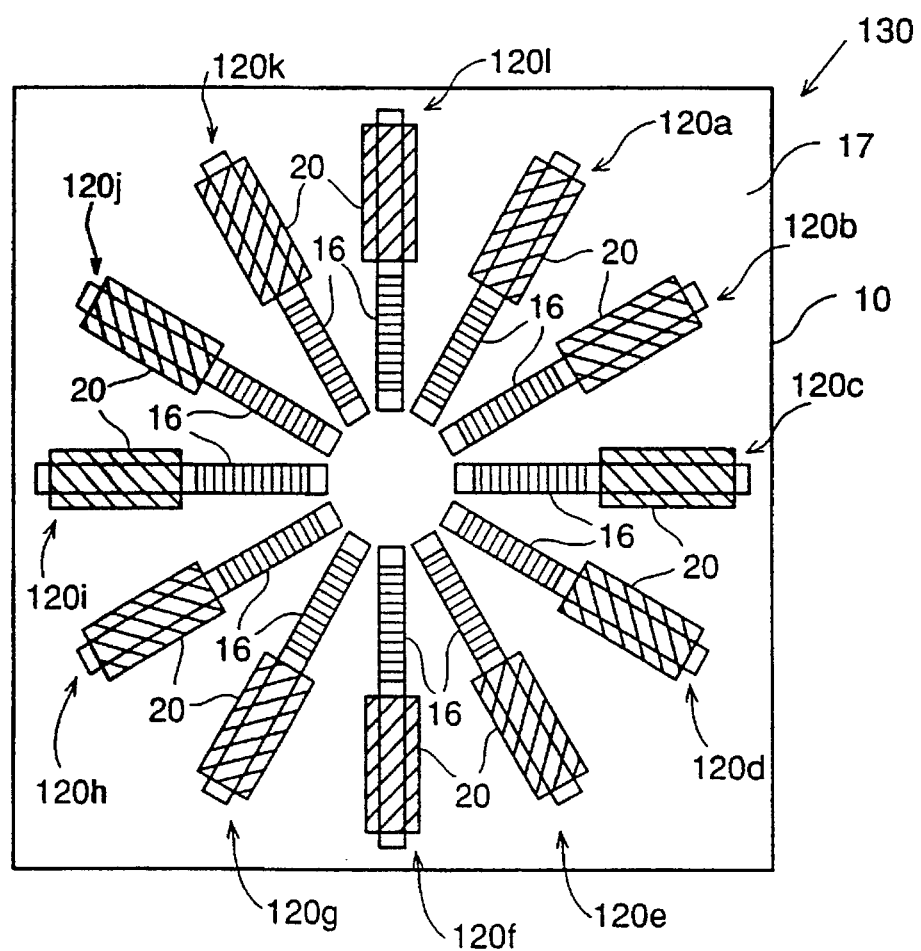
FIG. 13 is a plan view illustrating a photo-detector array in accordance with a seventh embodiment of the present invention.

FIG. 13 is a plan view illustrating a photodetector array in accordance with a seventh embodiment of the present invention. In this figure, the same reference numerals as in FIGS. 12 (a) and 12 (b) designate the same or corresponding parts. A photodetector array 130 includes an n type InP substrate 10. A plurality of photodetectors 120a to 120l, each having the structure shown in FIGS. 12 (a) and 12 (b), are radially arranged on the n type InP substrate 10 with a prescribed point on the substrate 10 as the center of the radial arrangement so that secondary diffraction gratings 16 of the respective photodetectors face the center point. The secondary diffraction gratings 16 of the respective photodetectors 120a to 120l have different pitches.

When the photodetector array 130 is used as a receiver for a multiple wavelength optical communication apparatus using an optical fiber, signal light having each wavelength is detected from the multiple wavelength light without using means for diverging light of the respective wavelengths from the optical fiber. In addition, since the size of the photodetector array 130 is reduced, the cost of the photodetector array is reduced. Further, since the optical waveguide layers of the adjacent photodetectors are not arranged parallel to each other, overlapping of wave surfaces of signal light traveling through the adjacent optical waveguide layers is insignificant, so that mutual interference due to leakage of optical signals between the adjacent optical waveguide layers is insignificant. As the result, the S/N ratio of the detected signal is increased, whereby high-purity signal light is detected.

Further, when the photodetectors 120a to 120l are arranged so that the projections of the secondary diffraction gratings of the adjacent photodetectors are not concentric with the prescribed point on the substrate as the center, the phases of light leaking from the optical waveguide layers of the respective photodetectors are shifted and cancel each other, whereby mutual interference is prevented.

Furthermore, when the pitches of the secondary diffraction gratings of at least two of the photodetectors 120a to 120l are the same, single wavelength light can be detected by a plurality of photodetectors having the same pitch, whereby the S/N ratio of an optical signal having a prescribed wavelength to be detected is further increased. Usually, when light is turned by 90°, the intensity of the light is reduced compared to rectilinearly propagating light although the monochromaticity of the wavelength of the light is increased. However, the described means compensates for the reduction in the intensity.

Figure 14:
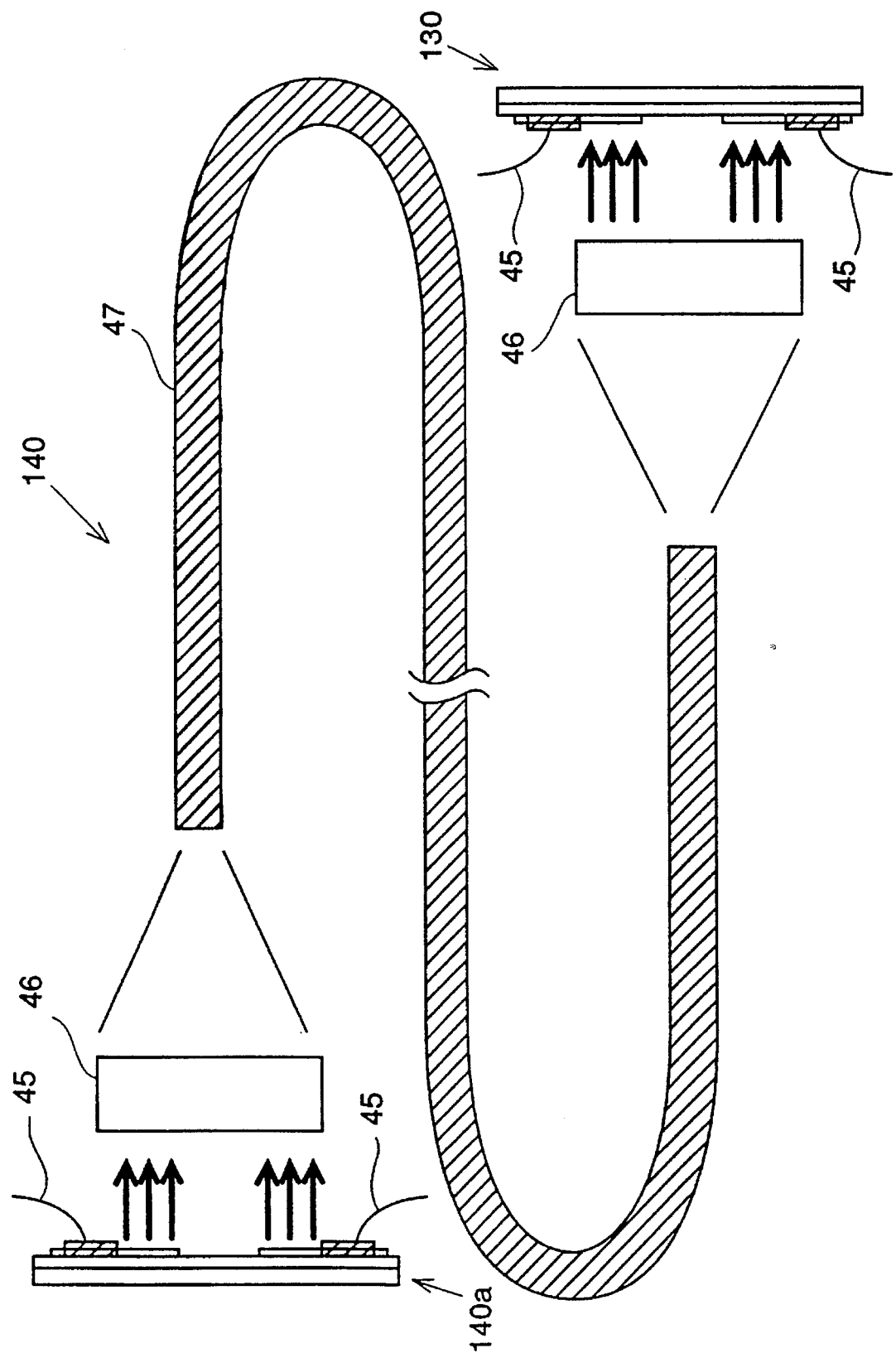
FIG. 14 is a schematic diagram illustrating a multiple wavelength optical communication system in accordance with an eighth embodiment of the present invention.
Figure 15:
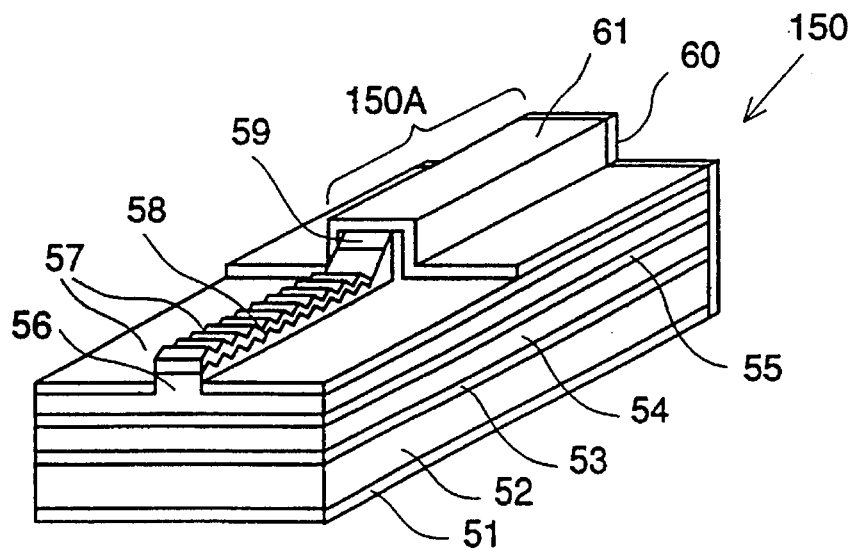
FIG. 15 is a perspective view illustrating a surface-emitting LD according to the prior art.
Figure 16:
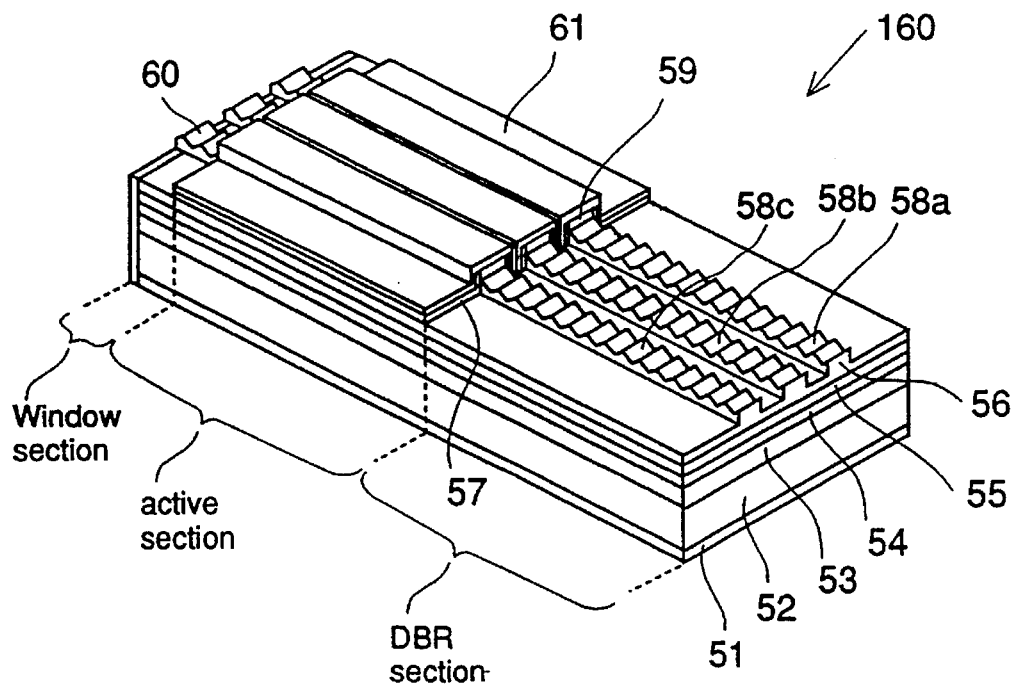
FIG. 16 is a perspective view illustrating a surface-emitting LD array according to the prior art.

FIG. 14 is a schematic diagram illustrating a multiple wavelength optical communication system in accordance with an eighth embodiment of the present invention including a surface-emitting LD array as described for the second embodiment as a transmitter and a photodetector array as described for the seventh embodiment as a receiver. In the multiple wavelength optical communication system 140 shown in FIG. 14, a surface-emitting LD array 140a that outputs multiple wavelength laser light as described for the second embodiment is connected to an end of an optical fiber 47 using an ordinary optical coupling means 46, and a photodetector array 130 including a plurality of photodetectors, each photodetector detecting light having a prescribed wavelength, as described for the seventh embodiment, is connected to the other end of the optical fiber 47 using the optical coupling means 46.

As the optical coupling means 46, confocal compound lens coupling means in which two lenses having relatively long focal lengths, such as a spherical lens and a GRIN (graded index) lens, are disposed at confocal positions. This means is conventionally employed as an optical coupling means between an LD and an optical fiber.

In the multiple wavelength optical communication system shown in FIG. 14, laser light beams having multiple wavelengths are simultaneously output from the surface-emitting LD array 140a to the optical fiber 47 without using laser light composite means, and the photodetector array 130 detects laser light of each wavelength from the multiple wavelength laser light transmitted through the optical fiber 47 without using light diverging means. Therefore, the structure of the system is simplified compared to a conventional communication system of this kind, reducing the cost.

While in the above-described first, second, third, fifth, and eighth embodiments a DBR-LD is used as a surface-emitting LD, a DFB-LD may be employed with the same effects as described above.

What is claimed is:

1. A surface-emitting laser diode array including:

a substrate having a center point; and a plurality of surface-emitting laser diodes respectively including secondary diffraction gratings having identical pitches and radially arranged on the substrate so that the secondary diffraction gratings face the center point of the substrate wherein the surface-emitting laser diodes are driven with different driving currents and to output respective laser light beams perpendicular to the substrate and having identical wavelengths and different phases that combine as a phase composite light beam steerable in three dimensions about the center point.

2. The surface-emitting laser diode array of claim 1 wherein said secondary diffraction gratings respectively include, periodically arranged along straight line segments, projections that are perpendicular to radii extending from the center point of the substrate.

3. The surface-emitting laser diode array of claim 1 wherein the substrate is a semiconductor substrate and the surface-emitting laser diodes are simultaneously produced on the semiconductor substrate.

4. The surface-emitting laser diode array of claim 2 wherein the substrate is a semiconductor substrate and the surface-emitting laser diodes are simultaneously produced on the semiconductor substrate.

5. The surface-emitting laser diode array of claim 3 including a plurality of grooves for heat radiation disposed in the substrate between adjacent surface-emitting laser diodes.

6. The surface-emitting laser diode array of claim 4 including a plurality of grooves for heat radiation disposed in the substrate between adjacent surface-emitting laser diodes.

7. The surface-emitting laser diode array of claim 1 wherein the substrate is an insulating substrate and the surface-emitting laser diodes are fabricated individually and mounted on the insulating substrate.

8. The surface-emitting laser diode array of claim 2 wherein the substrate is an insulating substrate and the surface-emitting laser diodes are fabricated individually and mounted on the insulating substrate.

9. The surface-emitting laser diode of claim 1 wherein driving currents applied to the respective surface-emitting laser diodes are controlled to change output direction of a composite laser light comprising laser light beam emitted from the respective laser diodes in an arbitrary direction.

10. The surface-emitting laser diode of claim 2 wherein driving currents applied to the respective surface-emitting laser diodes are controlled to change output direction of a composite laser light comprising laser light beam emitted from the respective laser diodes in an arbitrary direction.

11. A surface-emitting laser diode array including:
   a substrate having a main surface and a through-hole perpendicular to the main surface;
   a plurality of laser diodes, each laser diode including a facet from which laser light is emitted in a direction parallel to the main surface of the substrate, and radially arranged on the main surface of the substrate with the laser emitting facets of the respective laser diodes facing the through-hole in the substrate; and
   means for collecting laser light emitted from the respective laser diodes and outputting the collected laser light in a direction perpendicular to the main surface of the substrate.

12. The surface-emitting laser diode array of claim 11 wherein said laser diodes are distributed feedback laser diodes or distributed Bragg reflector laser diodes including primary diffraction gratings.

13. The surface-emitting laser diode array of claim 12 wherein the primary diffraction gratings of the respective laser diodes have identical pitches and oscillate at identical oscillation wavelengths.

14. The surface-emitting laser diode array of claim 12 wherein the primary diffraction gratings of the respective laser diodes have different pitches and oscillate at different wavelengths.

15. The surface-emitting laser diode array of claim 12 wherein the laser diodes are arranged so that projections of the primary diffraction gratings of adjacent laser diodes are not centric with the through-hole of the substrate.

16. The surface-emitting laser diode array of claim 14 wherein the laser diodes are arranged so that projections of the primary diffraction gratings of adjacent laser diodes are not centric with the through-hole of the substrate.

17. The surface-emitting laser diode array of claim 11 wherein the substrate is a semiconductor substrate and the laser diodes are simultaneously produced on the semiconductor substrate.

18. The surface-emitting laser diode array of claim 17 including a plurality of grooves for heat radiation disposed in the substrate between adjacent laser diodes.

19. The surface-emitting laser diode array of claim 11 wherein the substrate is an insulating substrate and the laser diodes are fabricated individually and mounted on the insulating substrate.

20. A spatial optical interconnection system comprising:
   a semiconductor light emitting element for converting electrical signals into optical signals and for radiating the optical signals into space, the semiconductor light emitting element comprising a substrate and a plurality of surface-emitting laser diodes respectively having secondary diffraction gratings having the same pitch and radially arranged on the substrate so that the secondary diffraction gratings face a point on the substrate, wherein the laser diodes are driven with different driving currents to output respective laser light beams perpendicular to the substrate and having identical wavelengths and different phases that combine as a phase composite light beam steerable in three dimensions about the point; and
   a photodetector for receiving the phase composite light beam and converting the phase composite light beam to an electrical signal.

21. The spatial optical interconnection system of claim 20 wherein the driving currents of the respective laser diodes are controlled to steer the phase composite light beam.

* * * * *

UNITED STATES PATENT AND TRADEMARK OFFICE
CERTIFICATE OF CORRECTION

PATENT NO. :  5,602,863
DATED      :  February 11, 1997
INVENTOR(S) : Itagaki

It is certified that error appears in the above-indentified patent and that said Letters Patent is hereby corrected as shown below:

Column 15: Line 31; change "beam" to --beams--.

Column 15, Line 26, change "beam" to --beams--;

Line 47, change "said" to --the--

Line 47, after "are" insert --one of --;

Column 16, Line 12, change "centric" to --concentric--;

Line 16, change "centric" to --concentric--.

Signed and Sealed this

Tenth Day of June, 1997

Attest:

BRUCE LEHMAN

Attesting Officer

Commissioner of Patents and Trademarks